(12) United States Patent
Elmufdi et al.

(10) Patent No.: US 7,606,698 B1
(45) Date of Patent: Oct. 20, 2009

(54) METHOD AND APPARATUS FOR SHARING DATA BETWEEN DISCRETE CLUSTERS OF PROCESSORS

(75) Inventors: Beshara G. Elmufdi, Sunnyvale, CA (US); Mitchell G. Poplack, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 256 days.

(21) Appl. No.: 11/526,967

(22) Filed: Sep. 26, 2006

(51) Int. Cl.
*G06F 9/455* (2006.01)

(52) U.S. Cl. .................... 703/25; 703/15; 717/134; 717/138; 717/141; 717/149

(58) Field of Classification Search ............ 703/23–25, 703/13–15; 717/101, 103, 124, 131, 134, 717/136, 138, 140, 141, 149; 716/1; 711/150, 711/168
See application file for complete search history.

(56) References Cited

U.S. PATENT DOCUMENTS

| | | | | |
|---|---|---|---|---|
| 5,546,391 | A | * | 8/1996 | Hochschild et al. ......... 370/413 |
| 5,551,013 | A | * | 8/1996 | Beausoleil et al. ............ 703/23 |
| 5,805,915 | A | * | 9/1998 | Wilkinson et al. ............ 712/20 |
| 5,943,490 | A | * | 8/1999 | Sample ........................ 703/28 |
| 6,618,698 | B1 | * | 9/2003 | Beausoleil et al. ............ 703/23 |
| 6,931,489 | B2 | * | 8/2005 | DeLano et al. ............... 711/122 |
| 2006/0190237 | A1 | * | 8/2006 | Beausoleil et al. ............ 703/23 |

OTHER PUBLICATIONS

Morin et al., C. Towards an Efficient Single System Image Cluster Operating System, Future Generation Computer Systems, vol. 20, Iss. 4, May 2004, pp. 505-521.*
Stone et al., J. Workstation Clusters for Parallel Computing, IEEE, Potentials, vol. 20, No. 2, Apr.-May 2001, pp. 31-33.*
Bilas et al., A. Using System Emulation to Model Next-Generation Shared Virtual Memory Clusters, Cluster Computing, vol. 6, No. 4, Oct. 2003, pp. 325-338.*

* cited by examiner

*Primary Examiner*—Russell Frejd
(74) *Attorney, Agent, or Firm*—Moser IP Law Group

(57) ABSTRACT

A method and apparatus for sharing data between processors within first and second discrete clusters of processors. The method comprises supplying a first amount of data from a first data array in a first discrete cluster of processors to selector logic. A second amount of data from a second data array in a second discrete cluster of processors is also supplied to the selector logic. The first or second amount of data is then selected using the selector logic, and supplied to a shared input port on a processor in the first discrete cluster of processors. The apparatus comprises selector logic for selecting between input data supplied by a first data array and a second data array. The data arrays are located within different discrete clusters of processors. The selected data is then supplied to a shared input port on a processor.

15 Claims, 6 Drawing Sheets

METHOD AND APPARATUS FOR SHARING DATA BETWEEN DISCRETE CLUSTERS OF PROCESSORS

BACKGROUND OF THE INVENTION

1. Field of the Invention

Embodiments of the present invention generally relate to processors, and more specifically, a method and compiler for sharing data between processors.

2. Description of the Related Art

Central processing units (CPU's) are composed of multiple primitives that evaluate a portion of data stored in an associated discrete data memory. Collectively, the primitives enable the CPU to evaluate all of the data stored in the entire data memory. The primitives may be transistor-based primitives, as in the PENTIUM PROCESSOR, multiplexer-based primitives as utilized in the CADENCE PALLADIUM II hardware emulator, or any other type of primitive typically used in a CPU.

Each primitive has a certain number of inputs and each input is capable of receiving a data bit(s) from its associated discrete data memory. The primitive evaluates the data bits and produces one or more output bits. The output bit is usually stored back in the associated discrete data memory and may also be provided to another primitive or placed onto a communications bus for use by another portion of the CPU. The output bit may also be provided to a hardware device, i.e., a debugger, a VLSI circuit, etc., or a software application that can access the communications bus.

A primitive does not always require use of all its inputs when receiving data from its associated discrete data memory. For example, a primitive with four inputs may require only three inputs to evaluate the received data. The primitive will still receive four inputs from the data memory, however, one of the inputs will be designated as a "do not care" input and ignored by the primitive during evaluation of the data.

A conventional primitive has one input per read port on its associated discrete data memory. An increase in the number of inputs into the primitive results in a need for a corresponding increase in the number of data memory read ports. As the number of data memory read ports and primitive inputs increases, the manufacturing cost of the CPU greatly increases.

Thus, there is a need in the art for a method and apparatus that enables a first primitive to share input data with a second primitive when the first primitive does not need all of its inputs to access data from a data memory.

SUMMARY OF THE INVENTION

The present invention generally relates to data sharing among discrete clusters of processors. A method and apparatus for sharing data between discrete clusters of processors is described. The method comprises supplying a first amount of data from a first data array in a first discrete cluster of processors to selector logic. A second amount of data from a second data array in a second discrete cluster of processors is also supplied to the selector logic. The first or second amount of data is then selected using the selector logic, and supplied to a shared input port on a processor in the first discrete cluster of processors. The apparatus is a hardware emulator comprising a processor in a first discrete cluster of processors. One of the input ports on the processor is a shared input port coupled to selector logic. The selector logic receives a first amount of input data from a first discrete data array within the first discrete cluster of processors and a second amount of input data from a second discrete data array within a second discrete cluster of processors. The selector logic selects an output, i.e., the first amount of input data or the second amount of input data, and supplies the output to the shared input port of the processor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is a method and apparatus for sharing data between discrete clusters of processors. Each discrete cluster of processors comprises a data array for supplying input data to a processor within the cluster of processors. The input data is also supplied to selector logic within a second discrete cluster of processors, enabling a processor within the second discrete cluster of processors to access input data from a source other than the data array within its own cluster of processors during a current emulation step. The computational efficiency of the hardware emulation is increased by the present invention because a processor does not have to wait extra emulation steps to retrieve data from another cluster. Although the invention is shown functioning within a hardware emulation system, it is intended that the invention will function in any device, e.g., a personal computer that utilizes a CPU composed of processors. The hardware emulation system is merely intended as one example in which the present invention can be utilized.

Figure 1:
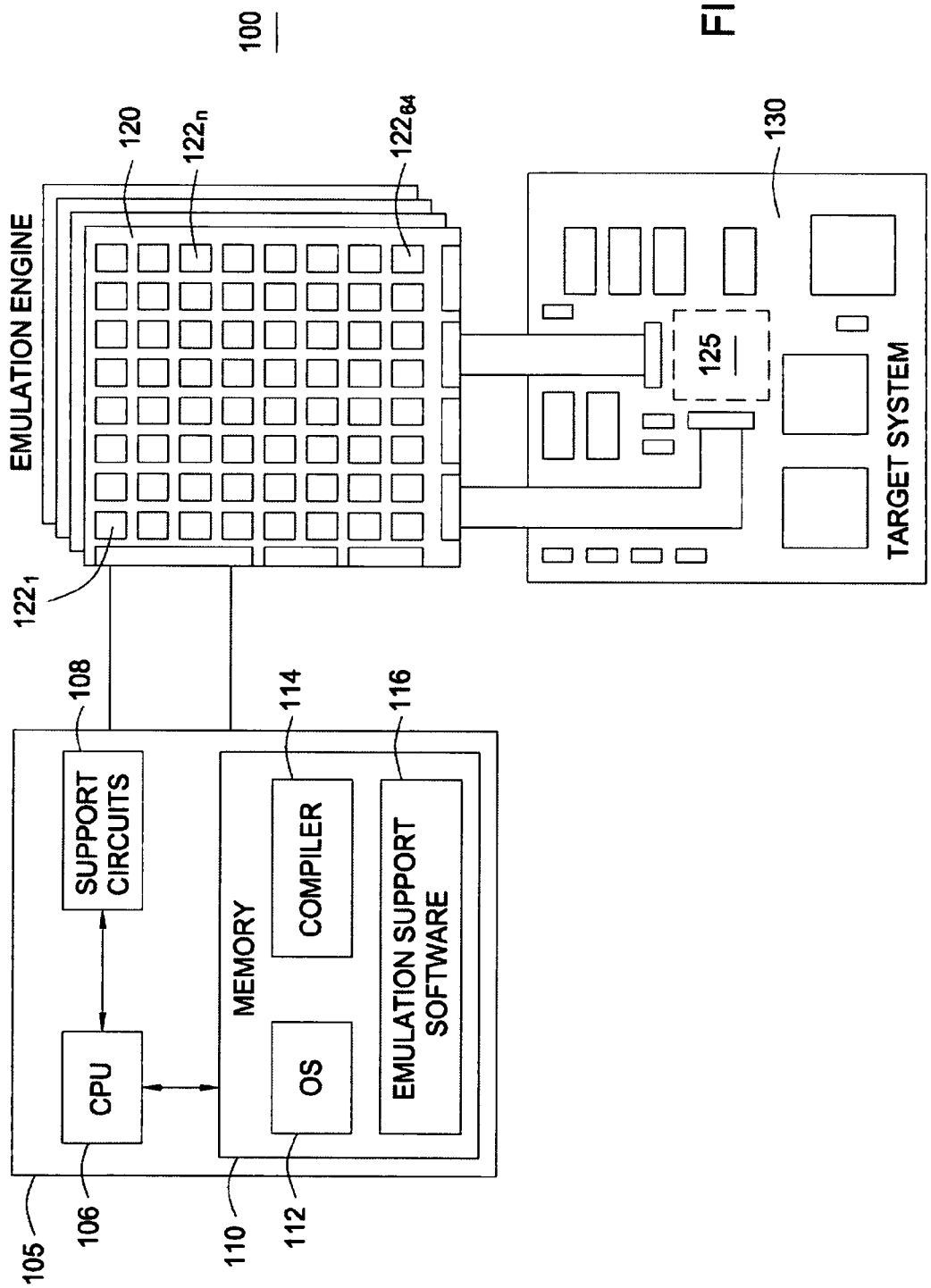
FIG. 1 is an overview of an emulation system.

FIG. 1 depicts an overview of an emulation system 100. The system comprises a computer workstation 105, an emulation board 120 and a target system 130. The computer workstation 105 provides emulation support facilities to the emulation board 120.

The computer workstation 105 comprises at least one central processing unit (CPU) 106, support circuits 108 and a memory 110. The CPU 106 may comprise one or more conventionally available microprocessors and/or microcontrollers. The support circuits 108 are well known circuits that are used to support the operation of the CPU 106. These circuits comprise power supplies, clocks, input/output interface circuitry, cache and the like.

Memory 110 may comprise random access memory, read only memory, removable disk memory, flash memory, optical storage and various combinations of these types of memory. The memory 110 is sometimes referred to as main memory and may in part be used as cache memory or buffer memory.

The memory 110 stores various forms of software and files, such as an operating system (OS) 112 and a compiler 114.

The compiler 114 converts a hardware design, e.g., hardware described in VHDL or Verilog, to a sequence of instructions that can be evaluated by the emulation board 120.

The computer workstation 105 allows a user to interface with the emulation board 120, control the emulation process and collect emulation results for analysis. The emulation board 120 is composed of individual emulation chips $122_1$ to $122_{64}$ (collectively 122). Under control of the computer workstation 105, programming information and data is loaded to the emulation board 120.

In response to the programming received from the emulation support facilities 110, the emulation board 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
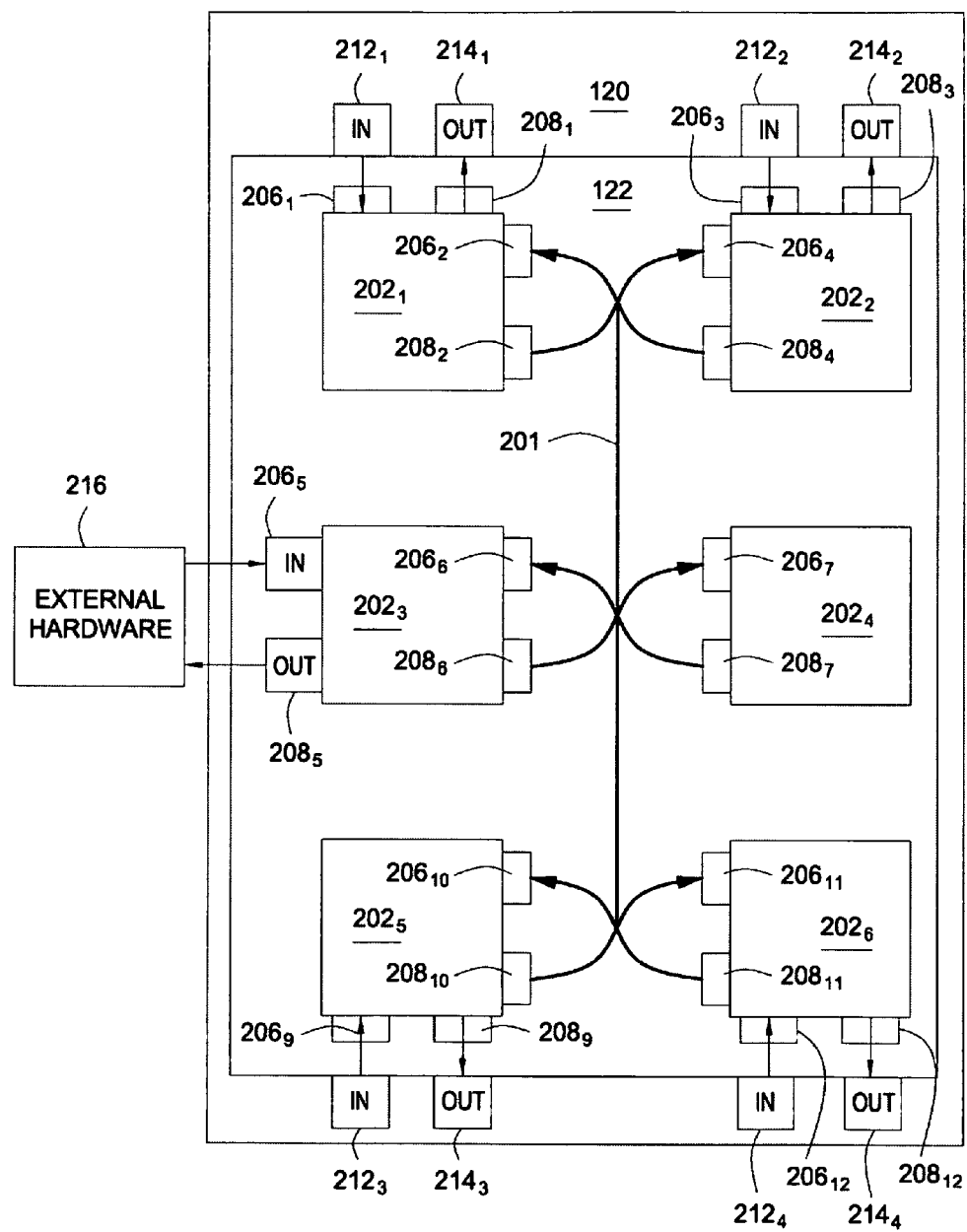
FIG. 2 is a block diagram of an emulation board.

FIG. 2 depicts an expanded view of an emulation chip 122 that is utilized by the emulation board 120. The emulation chip 122 comprises clusters of processors $202_1$ to $202_6$ (collectively 202) capable of communicating with each other via a communications bus 201. The communications bus 201 may be a wire, a cable, an intercluster crossbar, or any other type of link commonly used for communicating data. Each cluster of processors 202 has at least one input 206 and at least one output 208. The input 206 and output 208 allows each cluster of processors 202 to communicate with other clusters of processors 202, other emulation chips via input connectors 212 and output connectors 214, and external hardware 216. The external hardware 216 may be a VLSI circuit, a debugger, a memory, or any combination of hardware and software from which the emulation chip 122 can benefit. The emulation chip 122 has input connectors $212_1$ to $212_4$ (collectively 212) for receiving data from other emulation chips and output connectors $214_1$ to $214_4$ (collectively 214), known as chip pads, for supplying data to other emulation chips.

Figure 3:
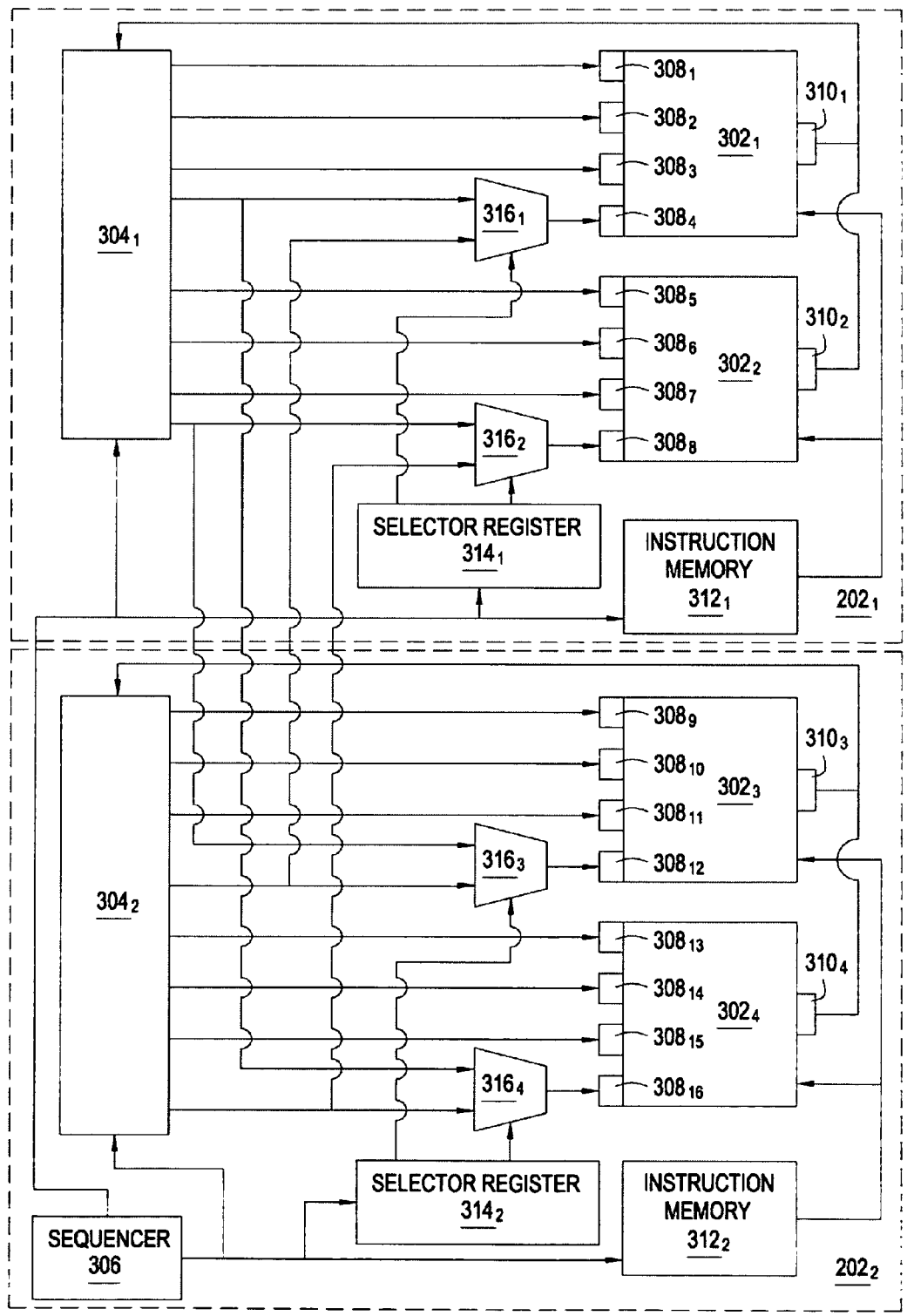
FIG. 3 is a block diagram of a cluster of processors arranged in accordance with one embodiment of the present invention.

FIG. 3 depicts two discrete clusters of processors $202_1$ and $202_2$ that can benefit from the present invention. The first discrete cluster of processors $202_1$ comprises processors $302_1$ and $302_2$, data array $304_1$, an instruction memory $312_1$, selector register $314_1$, and selector logics $316_1$ and $316_2$. The second discrete cluster of processors $202_2$ comprises processors $302_3$ and $302_4$, data array $304_2$, an instruction memory $312_2$, selector register $314_2$, and selector logics $316_3$ and $316_4$. Within the first discrete cluster of processors $202_1$, processors $302_1$ and $302_2$ are coupled to the data array $304_1$, and coupled to the instruction memory $312_1$. Within the second discrete cluster of processors $202_1$, processors $302_3$ and $302_4$ are coupled to the data array $304_2$, and coupled to the instruction memory $312_2$. A sequencer 306 is common to both clusters $202_1$ and $202_2$. The sequencer 306 is coupled to the data arrays $304_1$ and $304_2$, the instruction memories $312_1$ and $312_2$, and the selector registers $314_1$ and $314_2$ and provides timing information to components of the clusters of processors $202_1$ and $202_2$.

The processors 302 are fundamental components of the emulation engine 120. Each processor 302 has multiple input ports $308_n$ and a single output port $310_n$ (where n is an integer). The processor's primary function is to execute an N-input logical function (where N is an integer) and produce a single bit result known as a function bit out. The inputs for each logic function can be selected from a variety of sources, including bits stored from a previous operation in the data array 304 or from another one or more processors 302. The resulting function bit out may correspond to any one of: a logic gate output of the emulated design, a register output of the emulated design, a synthesized intermediate logic state, or a control bit generated for the emulation process.

Each processor 302 has multiple input ports 308 and one output port 310. For example, the processors 302 shown in FIG. 3 each have four input ports 308 for receiving data from the data array 304 and one output port 310 for writing data to the data array 304. The fourth input port ($308_4$, $308_8$, $308_{12}$, $308_{16}$) of each processor 302 is a shared input port. The shared input port ($308_4$, $308_8$, $308_{12}$, $308_{16}$) shares its input value provided from the data array $304_1$/$304_2$ with another shared input port ($308_4$, $308_8$, $308_{12}$, $308_{16}$) on a processor 302 in another cluster 202. For example, shared input port $308_4$ on processor $302_1$ in cluster $202_1$ shares its input value with shared input port $308_{12}$ on processor $302_3$ in cluster $202_2$.

In one embodiment of the invention, each processor 302 shares an input value with another processor 302 in, for example, a nearest neighbor cluster 202, i.e., processor $302_1$ in cluster $202_1$ shares an input value with processor $302_3$ in cluster $202_2$ and processor $302_2$ in cluster $202_1$ shares an input value with processor $302_4$ in cluster $202_2$. Input values are shared between processors 302 within nearest neighbor clusters, e.g., clusters $202_1$ and $202_2$, to overcome latency difficulties, i.e., sharing an input value with a processor 302 in a cluster further away may result in the input value not arriving during the current emulation step, resulting in computation of an incorrect value. Statistically, each processor 302 does not require all of its input ports 308 at each emulation step for receiving data from the data array 304. However, the data array 304 still provides input values to all of the input ports 308 of each processor 304. The input value provided from the data array 304 to a shared input port, e.g., input port $308_4$, is also provided to selector logic, e.g., selector logic $316_3$, can be redirected to another input port, e.g., $308_{12}$, on another processor 302.

The selector logic, e.g., selector logic $316_3$, selects which input value will be provided to a shared input port, e.g., $308_{12}$, of a processor, e.g., $302_3$, that shares data with another shared input port, e.g., $308_4$, of another processor $302_1$. In one embodiment of the invention, the selector logic 316 is a multiplexer. The selector logic, e.g., selector logic $316_1$, receives a first input value from the first data array $304_1$ and a second input value from the second data array $304_2$. The selector logic, e.g., selector logic $316_1$, also receives a selection signal, or "selector bits" from a selector register, e.g., selector register $314_1$. The selector logic 314 uses these selector bits to select between the first input value supplied from the first data array $304_1$ and the second input value supplied from the second data array $304_2$. The selected input value is then provided to the shared input port 308, e.g., shared input port $308_4$.

Each data array $304_1$ and $304_2$ stores function bit outs produced by the processors 302 at sequential write addresses provided by the sequencer 306. Data array $304_1$ stores function bit outs produced by processors $302_1$ and $302_2$; data array $304_2$ stores function bit outs produced by processors $302_3$ and $302_4$. The data array 304 is a special memory that has multiple read ports that correspond to the input ports 308 for each processor 302 in the cluster 202 and one write port that corresponds to one output port 310 for each processor 302 in the cluster 202. For example, cluster $202_1$ comprises processor $302_1$ having four input ports $308_1$ to $308_4$ and output port $310_1$, and processor $302_2$ having four input ports $308_5$ to $308_8$ and output port $310_1$. Data array $304_1$ has eight read ports corresponding to input ports $308_1$ to $308_8$ of processors $302_1$ and $302_2$ and two write ports corresponding to output ports $310_1$ and $310_2$ of processors $302_1$ and $302_2$. Similarly, data array $304_2$ has eight read ports corresponding to input ports $308_9$ to $308_{16}$ of processors $302_3$ and $302_4$ and two write ports corresponding to output ports $310_3$ and $310_4$ of processors $302_3$ and $302_4$. If there are eight processors 302 in a cluster 202, then the data arrays 304 will have 32 read ports (four read ports for each of the eight processors) and eight write ports (one write port for each of the eight processors) in total.

The instruction memories $312_1$ and $312_2$ store instruction words. The instruction memories $312_1$ and $312_2$ are coupled to the sequencer 306 and to the processors 302. The instruction memory receives read addresses from the sequencer 306 and provides instruction words to the processors 302. The instruction words control the operation of the processors 302.

The selector register 314 stores "selector bits" that are provided to the selector logics 316 under direction of the sequencer 306. The control bits function as a selection signal, and are used to select which input value will be provided to a shared input port, e.g., shared input port $308_4$.

The sequencer 306 supplies timing information to the clusters $202_1$ and $202_2$, provides read addresses to the instruction memories $312_1$ and $312_2$, read addresses to the selector registers $314_1$ and $314_2$, and provides sequential read and write addresses to the data arrays $304_1$ and $304_2$. The sequencer 306 starts at an initial value and increments to a maximal value. Each increment of the sequencer 306 causes the step value to advance from zero towards the maximal value and is equivalent to an emulation step. Collectively, all of the emulation steps form one emulation cycle. An emulation cycle is complete once the sequencer 306 reaches its maximal value. Upon reaching its maximal value, the sequencer 306 begins counting again from its initial value and a new emulation cycle is initiated.

By providing at least a portion of the data from a data array, e.g., $304_1$, in one cluster, e.g., $202_1$, to selector logic, e.g., $316_3$, in another cluster, e.g., $202_2$, input data can be shared between processors. The input data is shared between nearest neighbor clusters of processors. Sharing data between discrete clusters of processors, e.g., $202_1$ and $202_2$, increases the computational efficiency of the emulation system 100 because the shared data can be evaluated in fewer emulations steps.

Figure 4:
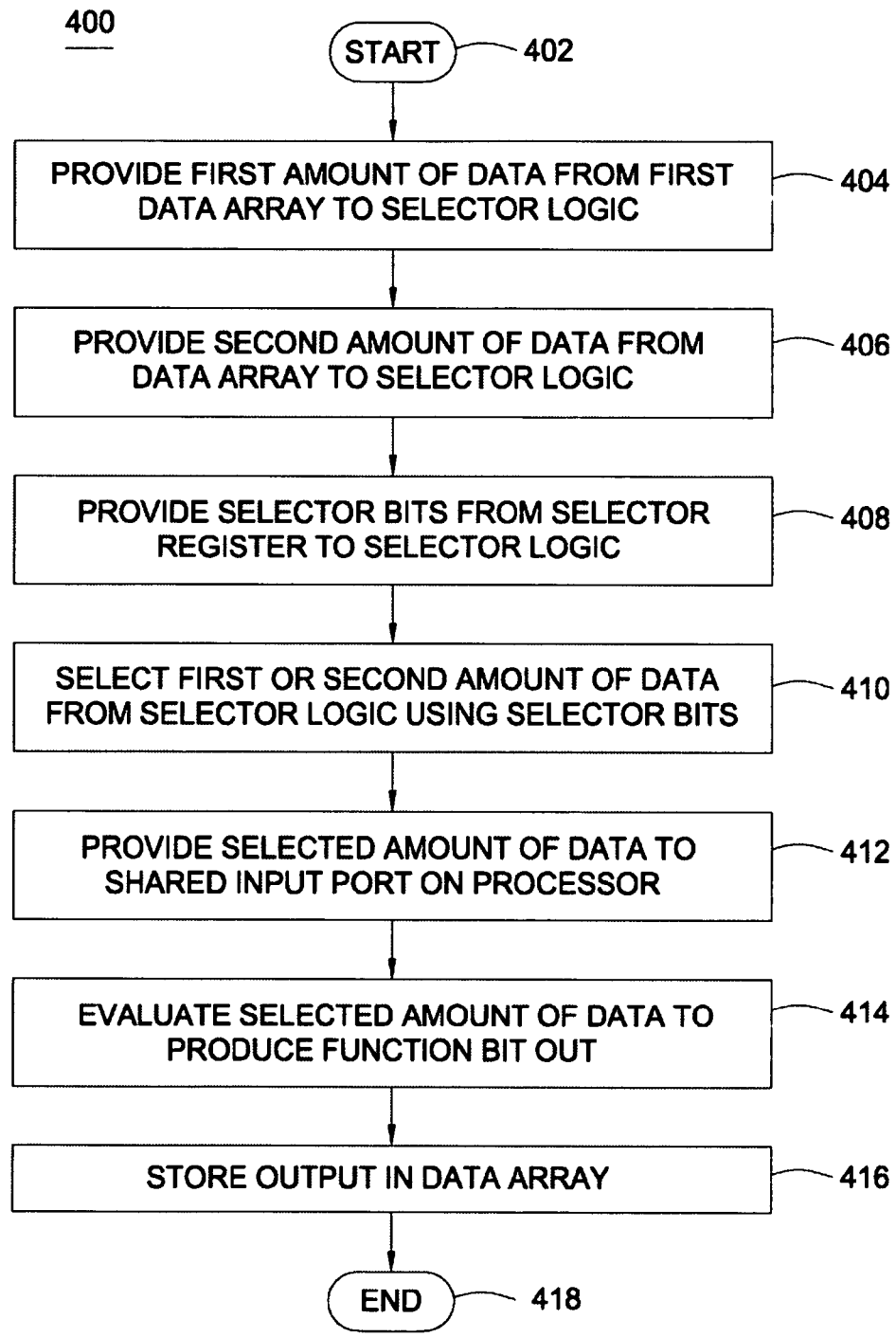
FIG. 4 is a flow diagram of a method that utilizes one embodiment of the present invention.

FIG. 4 depicts a flow diagram of a method 400 that utilizes one embodiment of the present invention. The method 400 starts at block 402 and proceeds to block 404. At block 404, a first amount of input data is provided from a data array $304_1$ within a first discrete cluster of processors $202_1$ to a selector logic $316_1$. In one embodiment of the invention, the first amount of input data is read from the first data array $304_1$ at a read address provided by a sequencer 306. At block 406, a second amount of input data is provided from a second data array $304_2$ within a second discrete cluster of processors $202_2$ to the selector logic $316_1$. In one embodiment of the invention, the second amount of input data is read from the second data array $304_2$ at a read address provided by the sequencer 306. At block 408, a selector register $314_1$ provides "selector bits" to the selector logic $316_1$. In one embodiment of the invention, the selector bits are selected from the selector logic $316_1$ by a read address provided by the sequencer 306. At block 410, the selector logic $316_1$ selects between the first amount of input data and the second amount of input data using the selector bits. At block 412, the selected amount of data is provided from the selector logic $316_1$ to a shared input port $308_4$ on a processor $302_1$. At block 414, the processor $302_1$ evaluates the selected amount of data, e.g., either the first amount of data or the second amount of data, and produces a function bit out. At block 416, the function bit out is stored in the data array $304_1$ at a write address provided by the sequencer 306. The method 400, ends at block 418.

Figure 5:
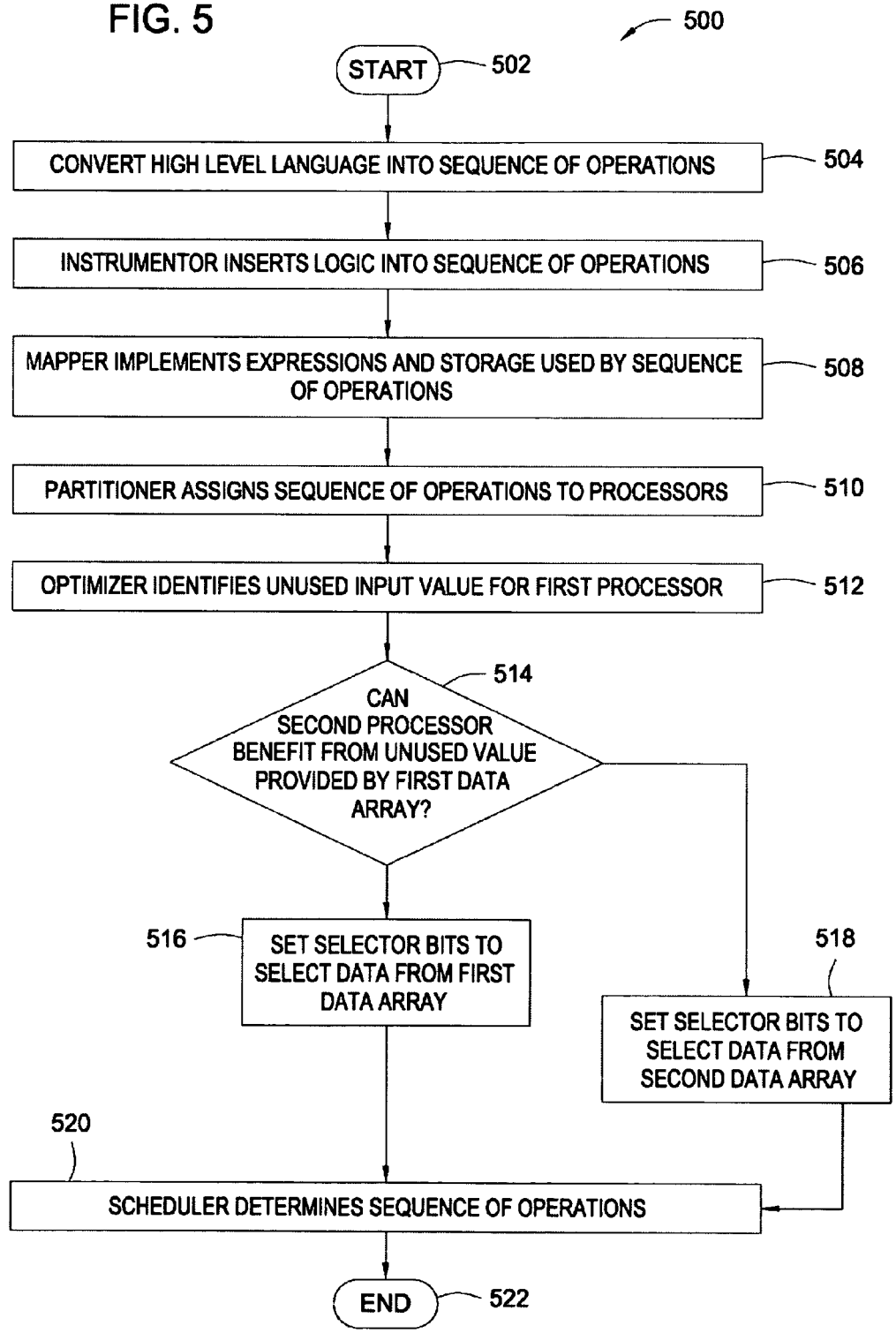
FIG. 5 is a flow diagram of a method that utilizes one embodiment of the compiler.
Figure 6:
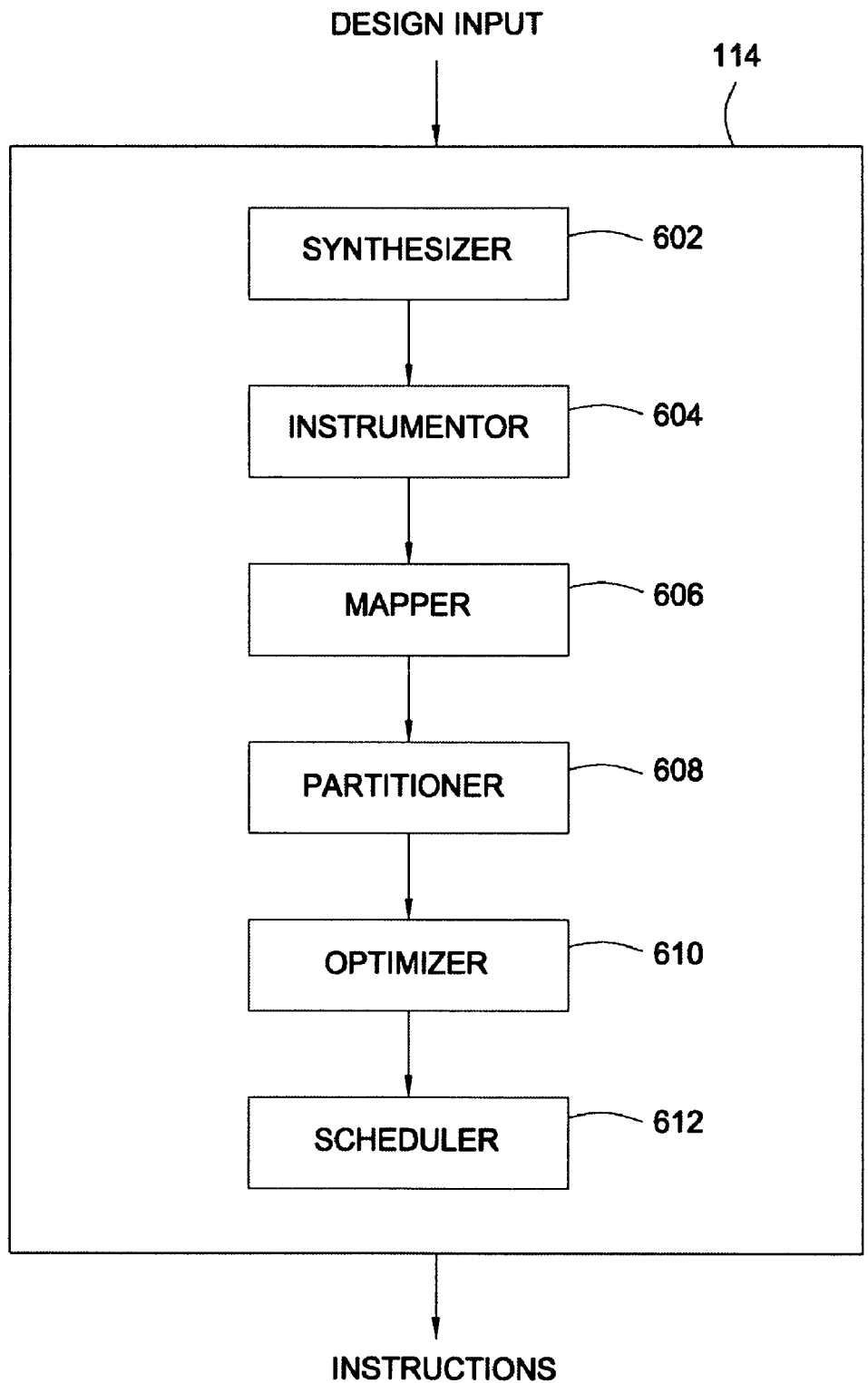
FIG. 6 is a functional block diagram of a compiler.

FIG. 5 depicts a flow diagram of a process 500 utilized by a compiler (shown in FIG. 1 as 114) in accordance with one embodiment of the present invention. FIG. 6 is a functional block diagram of the compiler 114. The compiler 114 translates the design under verification into instructions that can be stored in the instruction memories $312_1$ and $312_2$ and evaluated by the processors 302. The compiler 114 comprises a synthesizer 602, an instrumentor 604, a mapper 606, a partitioner 608, an optimizer 610, and a scheduler 612.

The process 500 begins at block 502 and proceeds to block 504. At block 504, the synthesizer 602 converts a high level language, such as C++, VERILOG, VHDL, E, etc., into a sequence of operations that can be evaluated by the processors 302. At block 506, the instrumentor 604 inserts logic into the sequence of operations. The logic includes circuits that provide visibility into the state of the signals (probe circuits) and circuits that stop model operation upon reaching certain conditions (breakpoint circuits).

At block 508, the mapper 606 implements the expressions and storage elements used by the sequence of operations. The expressions and storage elements must be of a type that can be evaluated by the processors 302. For example, if the processors 302 can only evaluate four input values at a time, any expression that uses more than four input values must be decomposed by the mapper 606 into a sequence of several instructions, i.e., several sequences of four input values or less.

At block 510, the partitioner 608 assigns the sequence of operations to one or more processors 302. The partitioner 608 may attempt to assign the sequence of operations to each of the processors 302 in such a way that each of the processors 302 completes evaluation of the sequence at approximately the same time, i.e., the load to be evaluated is distributed equally among all processors 302.

At block 512, the optimizer 610 identifies a first processor $302_1$ that is set by the partitioner 608 to evaluate a sequence of operations that does not require input values to be provided to all of the input ports 308 of the first processor $302_1$. For example, a certain sequence of operations may only require three input values to be provided to the first processor $302_1$. The first processor $302_1$ has four input ports; three input ports will receive the three input values required to complete evaluation of the sequence and the fourth input port will receive an input value that is ignored, i.e., not evaluated, by the first processor $302_1$. A first data array $304_1$ provides four input values to the first processor $302_1$ even though one of the input values is not necessary. The optimizer 610 identifies this first processor $302_1$ as being able to share this unused input value with a second processor $302_3$ during that particular emulation step.

The unused input value is also known as a shared input value. The unused (shared) input value is provided to selector logic, e.g., $316_3$. The selector logic selects an output value from a plurality of input values, e.g., input values provided by data arrays $304_1$ and $304_2$, and provides the selected output value to the processor, e.g., $302_3$, to be evaluated. The selector logic 316 selects the output value using selector bits provided by a selector register 314 as discussed above.

At decision block 514, the optimizer 610 determines if the second processor $302_3$ can benefit from the unused input value provided by the first data array $304_1$ to the first processor $302_1$. In one embodiment of the invention, the first and second processors $302_1/302_3$ are located within nearest neighbor clusters, i.e., clusters 202 closest in proximate distance to each other than any other clusters 202. If the second processor $302_3$ can benefit from the unused (shared) input value provided from the first data array $304_1$ to the selector logic 316, then the method 500 proceeds to block 516 and the optimizer 610 sets selector bits stored in a selector register 314 to select the input value provided from the first data array $304_1$ to the selector logic 316; if the second processor $302_3$ can not benefit from the unused (shared) input value provided from the first data array $304_1$ to the selector logic 316, then the method 600 proceeds to block 518 and the optimizer 610 sets selector bits stored in a selector register 314 to select the input value provided from the second data array $3042_2$ to the selector logic 316. The selected output is then provided from the selector logic 316 to the second processor $302_3$ for evaluation.

At block 620, the scheduler 612 determines the sequence of operations performed by each processor 302 based upon the availability of the operands and the resources to perform the operation. The scheduler 612 considers whether the result of a portion of the sequence of operations is necessary to determine the result of another portion of the sequence of operations. For example, if portion "a" of the sequence of operations is necessary to determine the result of portion "b" of the sequence of operations, then the scheduler 612 will assign portion "a" to be evaluated by the processors 302 prior to evaluating portion "b". The method ends at block 522.

The present invention provides a method and compiler for sharing data between processors that comprise a CPU. The method allows each processor to share input ports with another processor; the compiler creates instruction words that enable the processors to share the input ports with each other. The invention provides the additional benefit of increasing the number of input ports available to each processor in a CPU without requiring a corresponding increase in the size of the data array that provides input data to each processor.

While the foregoing is directed to embodiments of the present invention, other and further embodiments of the invention may be devised without departing from the basic scope thereof, and the scope thereof is determined by the claims that follow.

We claim:

1. A hardware emulator comprising:
    a processor in a first discrete cluster of processors, the processor having a plurality of input ports, wherein one of the input ports is a shared input port; and
    selector logic, coupled to the shared input port, for receiving a first amount of input data from a first discrete data array within the first discrete cluster of processors and a second amount of input data from a second discrete data array within a second discrete cluster of processors, where the selector logic is coupled to a selector register for controlling an output of the selector logic and the output of the selector logic is supplied to the shared input port.

2. The hardware emulator of claim 1 where the selector logic comprises a multiplexer.

3. The hardware emulator of claim 2 where the selector register provides at least one selector bit to the multiplexer to control the output of the selector logic.

4. The hardware emulator of claim 3 further comprising at least one instruction memory for providing an instruction word to the processor.

5. The hardware emulator of claim 4 further comprising a sequencer for providing at least one read address to the first data array, the second data array, the selector register and at least one write address to the first data array and the second data array.

6. A method of sharing data between processors in a hardware emulator comprising:
    a) supplying a first amount of data from a first data array in a first discrete cluster of processors to a selector logic;
    b) supplying a second amount of data from a second data array in a second discrete cluster of processors to the selector logic;
    c) selecting either the first amount of data or the second amount of data as a selected amount of data using the selector logic; and
    d) supplying the selected amount of data from the selector logic to a shared input port on a processor in the first discrete cluster of processors.

7. The method of claim 6 further comprising supplying at least one selector bit to the selector logic to select either the first amount of data or the second amount of data.

8. The method of claim 7 further comprising supplying an instruction word to the processor to evaluate either the first amount of data or the second amount of data.

9. The method of claim 8 further comprising providing at least one read address to the first data array, the second data array, a selector register and at least one write address to the first data array and the second data array.

10. The method of claim 6 wherein the steps a), b), c), and d) are performed within a single step of an emulation cycle.

11. A computer readable medium comprising a computer readable program, wherein the computer readable program when executed on a computer causes the computer to perform a method for:
    a) supplying a first amount of data from a first data array in a first discrete cluster of processors to a selector logic;
    b) supplying a second amount of data from a second data array in a second discrete cluster of processors to the selector logic;
    c) selecting either the first amount of data or the second amount of data from the selector logic as a selected amount of data; and
    d) supplying the selected amount of data from the selector logic to a shared input port on a processor in the first discrete cluster of processors.

12. The computer readable medium of claim 11, further comprising a computer readable program for supplying at least one selector bit to the selector logic to select either the first amount of data or the second amount of data.

13. The computer readable medium of claim 12, further comprising a computer readable program for supplying an instruction word to the processor to evaluate either the first amount of data or the second amount of data.

14. The computer readable medium of claim 13, further comprising a computer readable program for providing at least one read address to the first data array, the second data array, a selector register and at least one write address to the first data array and the second data array.

15. The computer readable medium of claim 11 further comprising a computer readable program for performing the steps a), b), c), and d) within a single step of an emulation cycle.

* * * * *

UNITED STATES PATENT AND TRADEMARK OFFICE
CERTIFICATE OF CORRECTION

PATENT NO. : 7,606,698 B1  Page 1 of 1
APPLICATION NO. : 11/526967
DATED : October 20, 2009
INVENTOR(S) : Elmufdi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 280 days.

Signed and Sealed this

Twelfth Day of October, 2010

David J. Kappos
*Director of the United States Patent and Trademark Office*